(12) United States Patent
Bai et al.

(10) Patent No.: US 11,560,616 B2
(45) Date of Patent: Jan. 24, 2023

(54) MASK DEVICE, MASK PLATE, AND FRAME

(71) Applicant: BOE TECHNOLOGY GROUP CO., LTD., Beijing (CN)

(72) Inventors: Shanshan Bai, Beijing (CN); Qiaonan Han, Beijing (CN); Yansong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 127 days.

(21) Appl. No.: 16/979,656

(22) PCT Filed: Nov. 5, 2019

(86) PCT No.: PCT/CN2019/115640
§ 371 (c)(1),
(2) Date: Sep. 10, 2020

(87) PCT Pub. No.: WO2021/087732
PCT Pub. Date: May 14, 2021

(65) Prior Publication Data
US 2021/0363628 A1 Nov. 25, 2021

(51) Int. Cl.
*C23C 14/04* (2006.01)
*B05C 21/00* (2006.01)

(52) U.S. Cl.
CPC .......... *C23C 14/042* (2013.01); *B05C 21/005* (2013.01)

(58) Field of Classification Search
None
See application file for complete search history.

(56) References Cited

U.S. PATENT DOCUMENTS 8,550,032 B2 * 10/2013 Park ............... C23C 14/042
118/504
8,656,859 B2 * 2/2014 Hong ............ H01L 51/0011
118/504
(Continued)

FOREIGN PATENT DOCUMENTS

CN 2572097 Y 9/2003
CN 202913047 U 5/2013
(Continued)

OTHER PUBLICATIONS

International Search Report of PCT/CN2019/115640 in Chinese, dated Jul. 27, 2020.
(Continued)

*Primary Examiner* — Jethro M. Pence
(74) *Attorney, Agent, or Firm* — Collard & Roe, P.C.

(57) ABSTRACT

A mask device, a mask plate and frame are provided. The mask device includes a frame and a first mask plate. The frame includes an inner edge, an outer edge, and a plurality of mounting grooves. A first mask plate includes a substrate, at least one first mask opening on the substrate, and a plurality of clamping portions protruding and extending outward from at least part of a periphery of the substrate. The plurality of clamping portions are mounted in the plurality of mounting grooves, respectively, so that the substrate is mounted on the inner edge of the frame. A direction along which the clamping portion extends from the substrate to a direction away from the substrate is a first direction, a direction perpendicular to the first direction is a second direction.

12 Claims, 10 Drawing Sheets

(56) References Cited

U.S. PATENT DOCUMENTS

| | | | | |
|---|---|---|---|---|
| 8,733,277 B2* | 5/2014 | Landgraf | | C23C 14/042 |
| | | | | 29/446 |
| 8,757,088 B2* | 6/2014 | Lee | | C23C 14/04 |
| | | | | 118/504 |
| 8,881,676 B2* | 11/2014 | Hong | | C23C 14/044 |
| | | | | 118/504 |
| 9,192,959 B2* | 11/2015 | Hong | | C23C 14/12 |
| 9,394,600 B2* | 7/2016 | Han | | B05C 21/005 |
| 9,583,708 B2* | 2/2017 | Ko | | C23C 14/042 |
| 9,604,240 B2* | 3/2017 | Ko | | B05B 12/29 |
| 9,821,416 B2* | 11/2017 | Kim | | B23K 37/0408 |
| 9,931,666 B2* | 4/2018 | Ahn | | B05C 21/005 |
| 9,975,134 B2* | 5/2018 | Ko | | C23C 14/042 |
| 10,014,471 B2* | 7/2018 | Baek | | C23C 14/042 |
| 10,186,662 B2* | 1/2019 | Kim | | H01L 51/56 |
| 10,301,715 B2* | 5/2019 | Yoo | | B05C 21/005 |
| 10,439,170 B2* | 10/2019 | Lin | | H01L 51/0011 |
| 10,625,289 B2* | 4/2020 | Gong | | C23C 14/042 |
| 10,663,857 B2* | 5/2020 | Lv | | C23C 14/12 |
| 10,774,415 B2* | 9/2020 | Lin | | C23C 14/042 |
| 10,787,729 B2* | 9/2020 | Bai | | C23C 14/042 |
| 10,868,268 B2* | 12/2020 | Kim | | H01L 51/5203 |
| 10,901,313 B2* | 1/2021 | Kim | | G03F 1/20 |
| 11,075,340 B2* | 7/2021 | Shin | | H01L 51/0097 |
| 11,203,808 B2* | 12/2021 | Zhu | | H01L 51/56 |
| 11,207,705 B2* | 12/2021 | Gong | | B23K 31/02 |
| 11,214,858 B2* | 1/2022 | Jin | | C23C 14/042 |
| 2011/0139069 A1* | 6/2011 | Ahn | | C23C 16/042 |
| | | | | 257/E33.001 |
| 2011/0146573 A1* | 6/2011 | Park | | C23C 14/042 |
| | | | | 118/712 |
| 2011/0220019 A1* | 9/2011 | Lee | | C23C 14/042 |
| | | | | 118/504 |
| 2013/0199443 A1* | 8/2013 | Kim | | C23C 16/042 |
| | | | | 118/504 |
| 2014/0130735 A1* | 5/2014 | Kim | | C23C 14/042 |
| | | | | 118/504 |
| 2014/0137798 A1* | 5/2014 | Ahn | | B05C 21/005 |
| | | | | 118/504 |
| 2014/0331926 A1* | 11/2014 | Kim | | C23C 14/042 |
| | | | | 118/504 |
| 2014/0373780 A1* | 12/2014 | Han | | B05C 21/005 |
| | | | | 118/504 |
| 2015/0007767 A1* | 1/2015 | Ko | | B05B 12/29 |
| | | | | 118/504 |
| 2017/0222145 A1* | 8/2017 | Kim | | B05C 21/005 |
| 2018/0169539 A1 | 6/2018 | Kozujevs et al. | | |
| 2018/0239241 A1* | 8/2018 | Lv | | B05C 21/005 |
| 2018/0358389 A1* | 12/2018 | Kim | | H01L 27/1288 |
| 2019/0010599 A1* | 1/2019 | Lin | | H01L 51/0011 |
| 2019/0078193 A1* | 3/2019 | Lin | | C23C 14/042 |
| 2019/0144987 A1* | 5/2019 | Guo | | H01L 51/56 |
| | | | | 118/504 |
| 2020/0002801 A1* | 1/2020 | Nakajima | | C30B 23/04 |
| 2020/0032382 A1* | 1/2020 | Li | | C23C 14/042 |
| 2020/0071813 A1* | 3/2020 | Kim | | C23C 14/042 |
| 2020/0123644 A1* | 4/2020 | Lee | | C23C 16/042 |
| 2020/0144530 A1* | 5/2020 | Kim | | H01L 51/5072 |
| 2020/0385856 A1* | 12/2020 | Yamabuchi | | C23C 14/042 |
| 2021/0164087 A1* | 6/2021 | Lin | | G03F 1/64 |
| 2021/0363628 A1* | 11/2021 | Bai | | C23C 14/042 |
| 2022/0158097 A1* | 5/2022 | Kim | | H01L 51/001 |

FOREIGN PATENT DOCUMENTS

| | | | | |
|---|---|---|---|---|
| CN | 104471257 A | | 3/2015 | |
| CN | 207278637 U | * | 4/2018 | ............... F16B 5/02 |
| CN | 207278637 U | | 4/2018 | |
| CN | 108823527 A | * | 11/2018 | ............ C23C 14/04 |
| CN | 108823527 A | | 11/2018 | |
| CN | 208532917 U | | 2/2019 | |
| EP | 2 133 444 A1 | | 12/2009 | |

OTHER PUBLICATIONS

Notice of Transmittal of the International Search Report of PCT/CN2019/115640 in Chinese, dated Jul. 27, 2020.

Written Opinion of the International Searching Authority of PCT/CN2019/115640 in Chinese, dated Jul. 27, 2020.

International Search Report of PCT/CN2019/115640 in Chinese, dated Jul. 27, 2020 with English Translation.

* cited by examiner

MASK DEVICE, MASK PLATE, AND FRAME

CROSS REFERENCE TO RELATED APPLICATIONS

This application is the National Stage of PCT/CN2019/115640 filed on Nov. 5, 2019, the disclosure of which is incorporated by reference.

TECHNICAL FIELD

At least one embodiment of the present disclosure relates to a mask device, a mask plate, and a frame.

BACKGROUND

Evaporation is one of the commonly used processes for thin film deposition, and in the process of thin film evaporation, a mask device is usually used. Organic light emitting diode (OLED) display panel is more and more popular in the market due to its advantages of self-illumination, low power consumption, high display brightness, wide viewing angle, and fast response speed. For example, the organic light emitting layer in an organic light emitting diode display panel can usually be formed by evaporation. With the development of the market demand, the application of organic light emitting diode display panel has expanded from mobile phones, computers, etc. to wearable fields, and what follows is that, the shape requirements of organic light emitting diode display panel are diversified, and the shape of display panel gradually changes from ordinary rectangle to other irregular shapes, such as circle, or polygon. The diversity of display panel shapes puts forward higher requirements for the evaporation mask plate used in the manufacture of display panels.

SUMMARY

At least one embodiment provides a mask device, comprising: a frame and a first mask plate. The frame comprises an inner edge, an outer edge, and a plurality of mounting grooves. The first mask plate comprises a substrate, at least one first mask opening arranged on the substrate, and a plurality of clamping portions protruding and extending outward from at least part of a periphery of the substrate. The plurality of clamping portions are configured to be mounted in the plurality of mounting grooves in one to one correspondence, so that the substrate is configured to be mounted on the inner edge of the frame. A direction along which the clamping portion extends from the substrate to a direction away from the substrate is a first direction, a direction perpendicular to the first direction is a second direction. At least one of the plurality of clamping portions comprises a first portion connected to the substrate, and a size of at least part of the first portion in the second direction gradually decreases in the first direction; and at least part of the first portion is extendable into the mounting groove corresponding to the clamping portion, so that a gap between the substrate and an orthographic projection of the inner edge of the frame on a plane where a face of the substrate parallel to the first direction is located is less than a size of the first portion of the at least one of the plurality of clamping portions in the first direction.

For example, in the mask device provided by an embodiment of the present disclosure, the first mask plate is basically abutted with a projection of the inner edge on a plane where the first mask plate is located.

For example, in the mask device provided by an embodiment of the present disclosure, at least one of the plurality of clamping portions further comprises a second portion, and the second portion is at a side of the first portion away from the substrate and protrudes and extends in a direction away from the substrate. The first portion comprises a side edge, the side edge of the first portion faces a clamping portion adjacent to the clamping portion, and the side edge of the first portion has an arc-shaped portion which is smoothly connected to the substrate and recessed toward the clamping portion; and the periphery of the substrate comprises a side surface, the side surface of the substrate is provided with the plurality of clamping portions and faces the inner edge of the frame; an orthographic projection of the arc-shaped portion on a plane where the side surface of the substrate is located is within an orthographic projection of the entirety of the at least one clamping portion on the plane where the side surface of the substrate is located.

For example, in the mask device provided by an embodiment of the present disclosure, all of the plurality of clamping portions have the same shape and size, and all the arc-shaped portions have the same shape and size; and a ratio of a size of the arc-shaped portion in the first direction to a maximum size of the clamping portion in the first direction is in a range from 0.15 to 0.2.

For example, in the mask device provided by an embodiment of the present disclosure, on a plane where the substrate is located, a connection point between the arc-shaped portion and the side surface of the substrate is within an orthographic projection of an edge of the second portion away from the substrate on the side surface of the substrate; and the connection point between the arc-shaped portion and the side surface of the substrate is within an orthographic projection of the mounting groove corresponding to the clamping portion on the side surface of the substrate.

For example, in the mask device provided by an embodiment of the present disclosure, the side surface of the substrate comprises a flat face between two adjacent clamping portions of the plurality of clamping portions, an orthographic projection of the flat face on a plane where the inner edge is located overlaps with the inner edge of the frame, and the arc-shaped portion does not contact the inner edge of the frame.

For example, in the mask device provided by an embodiment of the present disclosure, in the first direction, a width of the second portion of the at least one clamping portion in the second direction gradually increases; a width of the whole first portion of the at least one clamping portion in the second direction gradually decreases, or a width of the first portion of the at least one clamping portion in the second direction gradually decreases first and then gradually increases.

For example, in the mask device provided by an embodiment of the present disclosure, a plan shape of the second portion of each of the plurality of clamping portions on a plane where the first mask plate is located is an inverted trapezoid.

For example, in the mask device provided by an embodiment of the present disclosure, each of the plurality of mounting grooves comprises: a main body portion and at least one expansion portion. The at least one expansion portion communicates with the main body portion. The main body portion comprises a first part near the inner edge and a second part away from the inner edge, the first part of the main body portion communicates with the second part of the main body portion, and the expansion portion is located on a side surface of the first part of the main body portion facing the adjacent mounting groove and extends in a direction away from the main body portion. The expansion portion comprises an outer contour connected to the inner edge.

For example, in the mask device provided by an embodiment of the present disclosure, the arc-shaped portion is configured to be wholly located in the mounting groove corresponding to the clamping portion, and at least part of the arc-shaped portion is configured to be accommodated in the expansion portion.

For example, in the mask device provided by an embodiment of the present disclosure, a side surface of the substrate comprises a flat face between two adjacent clamping portions, an orthographic projection of the flat face on a plane where the inner edge is located overlaps with the inner edge, and the chamfer does not contact the inner edge of the frame.

For example, in the mask device provided by an embodiment of the present disclosure, in the second direction and in a direction from the main body portion to away from the main body portion, a size of the expansion portion in the first direction gradually decreases.

For example, in the mask device provided by an embodiment of the present disclosure, each of the plurality of clamping portions comprises a portion in a plane where the substrate parallels to the first direction, the portion has a plan shape of rectangle or inverted trapezoid, and the inverted trapezoid comprises a first side edge near the substrate and a second side edge away from the substrate, and the first side is shorter than the second side.

For example, in the mask device provided by an embodiment of the present disclosure, a maximum width of each of the mounting grooves in the second direction is greater than a maximum width of each of the clamping portions in the second direction, and a difference between a maximum width of each of the mounting grooves and a maximum width of each of the clamping portions is in a range from 0.5 mm to 1 mm.

For example, in the mask device provided by an embodiment of the present disclosure, a depth of each of the plurality of mounting grooves in a direction perpendicular to a plane where the first mask plate is located is greater than or equal to a thickness of the clamping portion in a direction perpendicular to the plane where the first mask plate is located.

At lease one embodiment of the present disclosure also provides a mask plate, comprising: a substrate; at least one first mask opening arranged on the substrate; and a plurality of clamping portions protruding and extending outward from at least part of a periphery of the substrate. A direction along which the clamping portion extends from the substrate to a direction away from the substrate is a first direction, a direction perpendicular to the first direction is a second direction; at least one of the plurality of clamping portions comprises a first portion connected to the substrate, and a width of at least part of the first portion of the at least one clamping portion in the second direction gradually decreases in the first direction.

For example, in the mask plate provided by an embodiment of the present disclosure, the first portion comprises a side edge, the side edge of the first portion faces a clamping portion adjacent to the clamping portion, and the side edge of the first portion has an arc-shaped portion which is smoothly connected to the substrate and recessed toward the clamping portion; the periphery of the substrate comprises a side surface, the side surface is intersected with a surface of the substrate parallel to the first direction, the side surface of the substrate is provided with the plurality of clamping portions; an orthographic projection of the arc-shaped portion on a plane where the side surface of the substrate is located is within an orthographic projection of the at least one clamping portion on the plane where the side surface of the substrate is located.

For example, in the mask plate provided by an embodiment of the present disclosure, at least one of the plurality of clamping portions further comprises a second portion, the second portion is at a side of the first portion away from the substrate and protrudes and extends in a direction away from the substrate; a connection point between the arc-shaped portion and the side surface of the substrate is within an orthographic projection of an edge of the second portion away from the substrate on the side surface of the substrate.

For example, in the mask device provided by an embodiment of the present disclosure, in the second direction, a width of the second portion of the at least one clamping portion in the second direction gradually increases; a width of the whole first portion of the at least one clamping portion in the second direction gradually decreases, or a width of the first portion of the at least one clamping portion in the second direction gradually decreases first and then gradually increases.

For example, in the mask plate provided by an embodiment of the present disclosure, a plan shape of the second portion of the at least one clamping portion on a plane where the substrate is located is an inverted trapezoid.

At least one embodiment of the present disclosure also provides a mask plate, comprising: a plurality of mounting grooves and a main body portion. At least one mounting groove of the plurality of mounting grooves comprises a main body portion and at least one expansion portion communicated with the main body portion. The main body portion comprises a first part near the inner edge and a second part away from the inner edge, the first part of the main body portion communicates with the second part of the main body portion, and the expansion portion is located on a side surface of the first part of the main body portion facing the adjacent mounting groove and extends in a direction away from the main body portion, and the expansion portion comprises an outer contour which is connected to the inner edge.

For example, in the frame provided by an embodiment of the present disclosure, in the second direction and in a direction from the main body portion to away from the main body portion, a size of the expansion portion in the first direction gradually decreases

BRIEF DESCRIPTION OF THE DRAWINGS

In order to clearly illustrate the technical schemes of the embodiments of the disclosure, the drawings of the embodiments will be briefly described in the following. It is apparent that the described drawings are only related to some embodiments of the disclosure and not limitative of the disclosure.

DETAILED DESCRIPTION

Figure 1:
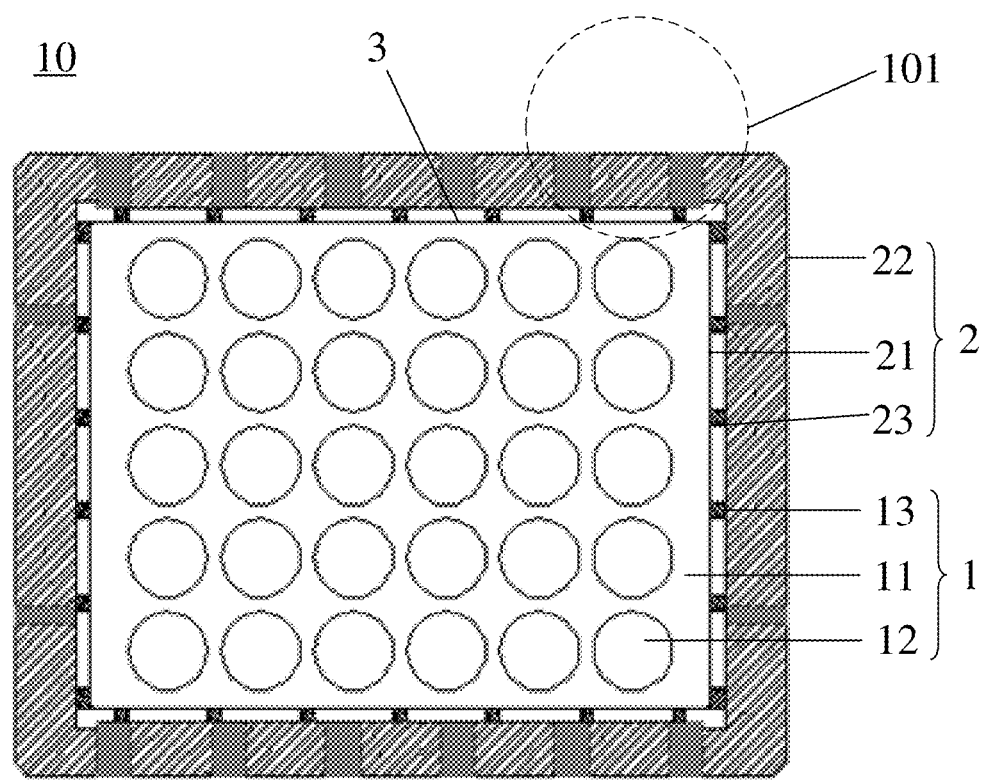
FIG. 1 is a schematic plan view of a mask device according to an embodiment of the present disclosure.

In order to make objects, technical solutions and advantages of the embodiments of the disclosure apparent, technical solutions of the embodiments will be described in a clearly and completely way in connection with the drawings related to the embodiments of the disclosure. Apparently, the described embodiments are a part but not all of the embodiments of the disclosure. Based on the described embodiments herein, one of ordinary skilled in the art can obtain other embodiment(s), without any creative labor, which shall be within the scope of the present disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not exclude other elements or objects. The terms, such as "connect/connecting/connected," "couple/coupling/coupled" or the like, are not limited to a physical connection or mechanical connection, it may also include an electrical connection/coupling, directly or indirectly. The terms, 'on,' 'under,' 'left,' 'right,' or the like are only used to indicate relative position relationship, and when the absolute position of the object which is described is changed, the relative position relationship may be changed accordingly Evaporation mask plate is usually mounted on a mask frame, and a clamping portion of the edge of the mask plate can be clamped by a plurality of clamping structures of the mask frame. Due to the limitation of manufacturing process, the bottom of the clamping portion at the edge of the mask plate usually has a chamfer, which contacts the clamping structure of the mask frame and is located between the edge of the mask plate near the mask frame and the mask frame, so that the edge of the mask plate near the mask frame is not tightly combined with the mask frame, and there is a large gap between them. In this case, in the evaporation process, the evaporation material will be deposited on the surface of the evaporation mask plate and on, for example, the peripheral edge of the glass substrate of the panel to be evaporated through the large gap, which may cause particle pollution and easily lead to encapsulation failure, for example, it may lead to the encapsulation film defects and the like.

At least one embodiment of the present disclosure provides a mask device, the mask device includes: a frame and a first mask plate. The frame includes an inner edge, an outer edge, and a plurality of mounting grooves. The first mask plate includes a substrate, at least one first mask opening arranged on the substrate, and a plurality of clamping portions protruding and extending outward from at least part of the periphery of the substrate. The clamping portions are configured to be mounted in the plurality of mounting grooves in one to one correspondence, so that the substrate is configured to be mounted on the inner edge of the frame. A direction along which the clamping portion extends from the substrate to a direction away from the substrate is a first direction, and a direction perpendicular to the first direction is a second direction. At least one of the plurality of clamping portions includes a first portion connected to the substrate, and the size of at least part of the first portion in the second direction gradually decreases in the first direction. At least part of the first portion is extendable into the mounting groove corresponding to the clamping portion, so that the gap between the substrate and the orthographic projection of the inner edge of the frame on a plane where a face of the substrate parallel to the first direction is located is less than a size of the first portion of the at least one of the plurality of clamping portions in the first direction.

For example, the gap between the first mask plate and the projection of the inner edge on the plane where the first mask plate is located is less than 2 mm. For example, the "gap is less than 2 mm" includes that the gap is less than 1.5 mm, 1.2 mm, 1 mm, 0.8 mm, 0.5 mm, 0.3 mm, etc., or, 0 (i.e., the gap does not exist).

Figure 2A:
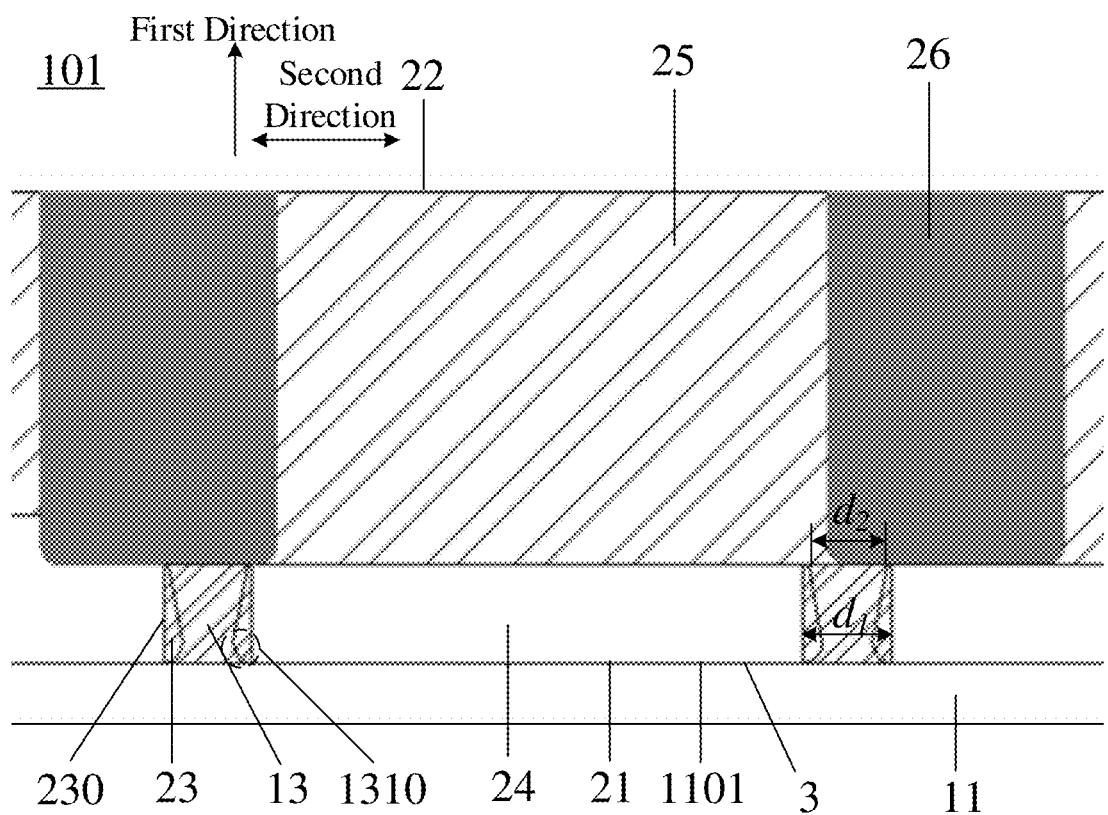
FIG. 2A is a partial structural diagram of a mask device according to an embodiment of the present disclosure.
Figure 2B:
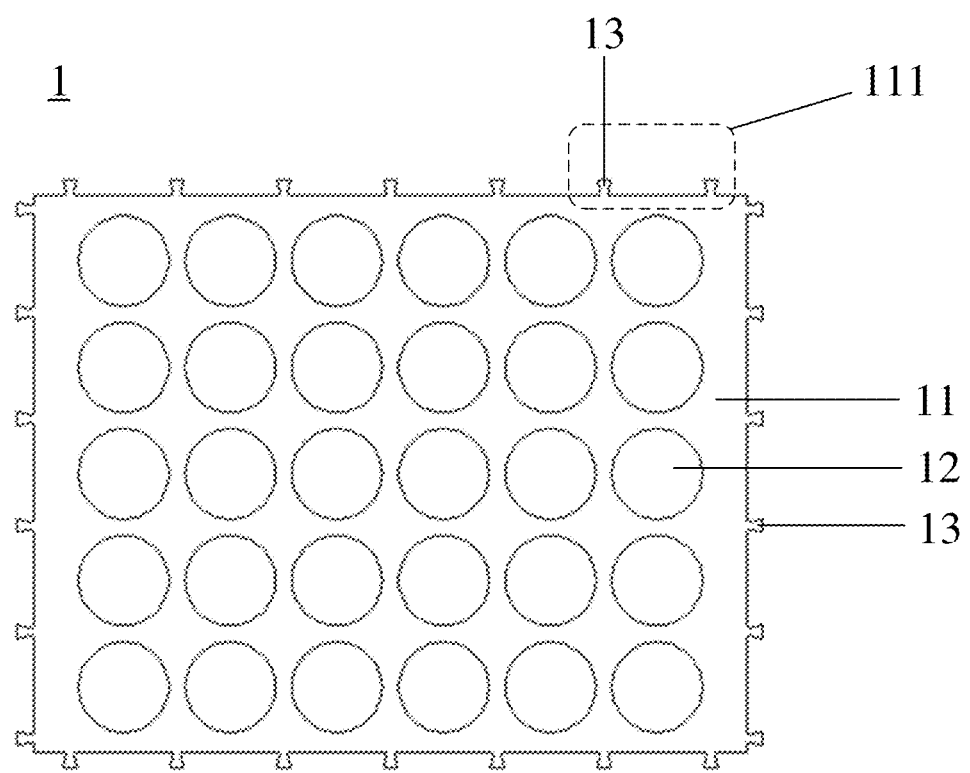
FIG. 2B is a schematic plan view of a mask plate of the mask device illustrated in FIG. 2A.
Figure 2C:
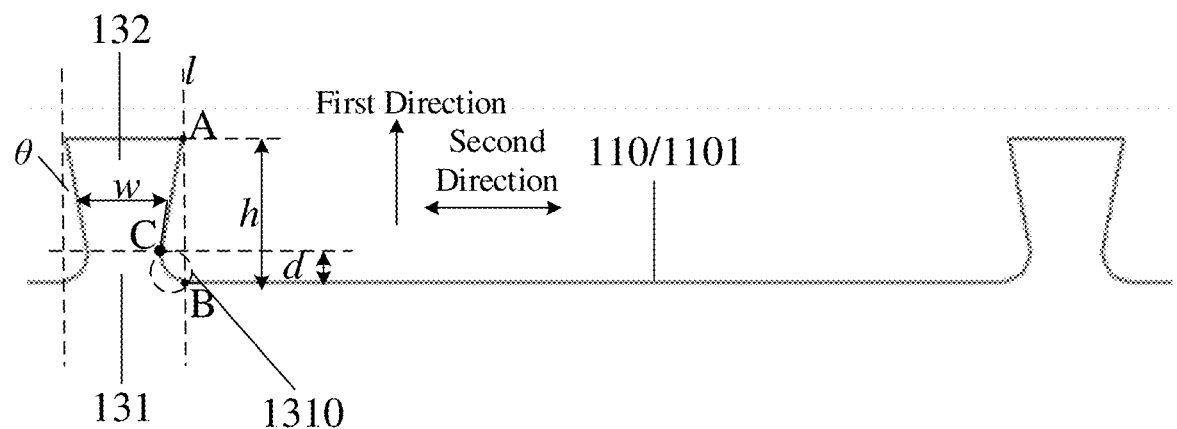
FIG. 2C is a partially enlarged schematic diagram of FIG. 2B.

Exemplarily, FIG. 1 is a schematic plan view of a mask device provided by an embodiment of the present disclosure, FIG. 2A is a partial structural diagram of a mask device according to an embodiment of the present disclosure, FIG. 2B is a schematic plan view of a mask plate of the mask device illustrated in FIG. 2A, and FIG. 2C is a partially enlarged schematic diagram of FIG. 2B. For example, FIG. 2A is an enlarged structural diagram of part 101 of FIG. 1.

As illustrated in FIG. 1 and FIG. 2A, the mask device 10 includes a frame 2 and a first mask plate 1. The frame 2 includes an inner edge 21, an outer edge 22, and a plurality of mounting grooves 23. The first mask plate 1 includes a substrate 11, at least one first mask opening 12 arranged on the substrate, and a plurality of clamping portions 13 protruding and extending outward from at least part of the periphery of the substrate 11, and the plurality of clamping portions 13 are mounted in the plurality of mounting grooves 23 in one to one correspondence, so that the substrate 11 is mounted on the frame 2. A direction along which the clamping portion 13 extends from the substrate 11 to a direction away from the substrate 11 is a first direction, and a direction perpendicular to the first direction is a second direction. At least one of the plurality of clamping portions 13 includes a first portion 131 connected to the substrate 11. For example, in the embodiment illustrated in FIG. 2C, in the first direction, the size of the whole first portion 131 in the second direction gradually decreases. At least part of the first portion 131 can extend into the mounting groove 23 corresponding to the clamping portion 13, that is, the connection position between each clamping portion 13 and the substrate 11 is located in the mounting groove 23 corresponding to the clamping portion 13, so that the gap between the substrate 11 and the orthographic projection of the inner edge 21 of the frame 2 on the plane where a face of the substrate 11 parallel to the first direction is located is less than the size of the first portion 131 of the at least one clamping portion 13 in the first direction.

For example, the gap 3 between the first mask plate 1 and the projection of the inner edge 21 on the plane where the first mask plate 1 is located is less than 2 mm That is, the width of the gap 3 between the edge of the substrate 11 near the frame 2 and the inner edge 21 of the frame is less than 2 mm on the plane where the first mask plate 1 is located.

A chamfer often exists at the connection position between each of the plurality of clamping portions 13 and the substrate 11 due to the manufacturing process, such as an etching process. Because of the design of the first portion 131, the chamfer is included in the first portion 131, for example, the chamfer is one end of the first portion 131 near the substrate 11, and at least part of the whole first portion 131 is located in the mounting groove 23 corresponding to the clamping portion 13, so that at least part of the chamfer can be located in the mounting groove 23 corresponding to the clamping portion 13. In this way, the mask device provided by at least one embodiment of the present disclosure can reduce the gap between the first mask plate 1 and the projection of the inner edge 21 of the frame on the plane where the first mask plate 1 is located, so that the first mask plate 1 and the frame 2 are more tightly combined. For example, the mask device 10 is an evaporation mask device, so that the mask device 10 can prevent or improve the problems caused by the large gap in the evaporation process. These problems include, for example, the evaporation material is deposited on the surface of the evaporation mask plate and the peripheral edge of the glass substrate of the panel to be evaporated through the gap, causing particle pollution, easily leading to encapsulating failure, for example, leading to the encapsulation film defects and the like. Even if there is an etching chamfer at the connection position between each of the plurality of clamping portions and the substrate 11 due to a manufacturing process, such as an etching process, it is also possible to prevent or improve the problem caused by the large gap in the evaporation process.

For example, the first mask plate illustrated in FIG. 2A includes a plurality of circular first mask openings 12, for example, each opening corresponds to a display region of one display panel (daughter board) in a motherboard, for example, a circular display region. In other embodiments, the shape of the first mask opening 12 can also be other shapes, such as rectangle, sector, or irregular shapes, etc. The shape of the first mask opening 12 is designed according to the actual needs of patterning, which is not limited by the embodiments of the present disclosure.

For example, in an embodiment, the first mask plate 1 and the projection of the inner edge 21 on the plane where the first mask plate 1 is located is basically abutted, that is, the width of the gap 3 between the substrate 11 and the inner edge 21 is nearly zero; or the overlapping area of the first mask plate 1 and the projection of the inner edge 21 on the plane where the first mask plate 1 is located is greater than or equal to 0, that is, there is no air layer or gap between the first mask plate 1 and the inner edge 21. In this way, a tighter assembly effect can be achieved, and the above technical problems caused by the gap can be better prevented.

It is to be noted that the frame 2 includes an inner region 24, and the plurality of mounting grooves 23 are concave grooves on the surface of the inner region 24. The inner edge 21 is the inner edge of the frame, which is the edge of the frame near the substrate 11. The plurality of clamping portions of the first mask plate 1 protrude outward from the periphery of the substrate 11 refers to protruding in a direction away from the substrate 11.

Figure 2D:
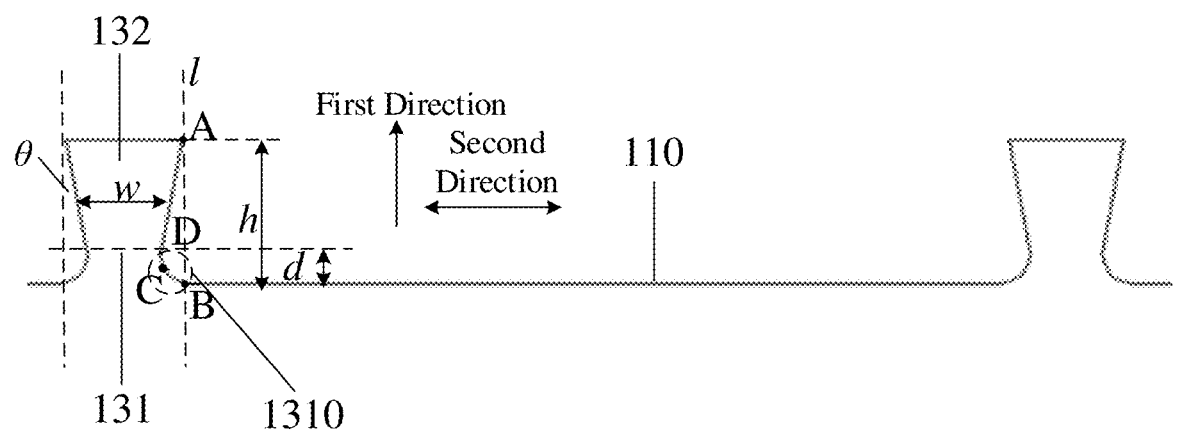
FIG. 2D is another partially enlarged schematic diagram of FIG. 2B.

In an embodiment, as illustrated in FIGS. 2A-2C, at least one clamping portion 13 of the plurality of clamping portions 13, for example, each clamping portion 13, further includes a second portion 132, which is located at a side of the first portion 131 away from the substrate 11, and protrudes and extends in a direction away from the substrate 11, and the second portion 132 is connected to the first portion 131 of the substrate 11. For example, in the embodiment illustrated in FIG. 2C, in the first direction, the width of the whole first portion 131 of each clamping portion 13 in the second direction gradually decreases. The periphery of the substrate 11 includes a side surface 110, the side surface 110 is provided with a plurality of clamping portions 13 and faces the inner edge 21 of the frame 2. The first portion 131 includes a side edge, and the side edge of the first portion 131 faces a clamping portion 13 adjacent to the clamping portion 13. The side edge of the first portion 131 has an arc-shaped portion 1310 which is smoothly connected to the substrate 11 and recessed toward the clamping portion 13. The position B is the intersection point of the arc-shaped portion 1310 and the side surface 110 of the substrate 11, and the position C is the intersection position of the first portion 131 and the second portion 132. That is, in the first direction and from the position B to the position C, the width of the whole first portion 131 of each clamping portion 13 in the second direction gradually decreases. For example, in the embodiments illustrated in FIGS. 2A-2C, two sides of the side wall 230 of the first portion 131 facing the mounting groove 23 corresponding to the clamping portion 13 have arc-shaped portions 1310. As illustrated in FIG. 2A, because the width of the arc-shaped portion 1310 recessed inward in the second direction gradually decreases in the first direction, one end of the clamping portion 13 connected to the substrate 11 can be totally shrunk into the corresponding mounting groove 23, that is, the one end of the clamping portion 13 connected to the substrate 11 is completely located in the corresponding mounting groove 23. In this way, the gap 3 between the first mask plate 1 and the projection of the inner edge 21 on the plane where the first mask plate 1 is located is decreased, so as to achieve the above technical effect. Or, as illustrated in FIG. 2D, the width of the first portion 131 of each clamping portion 13 in the second direction first gradually decreases and then gradually increases. The position B is the intersection point of the arc-shaped portion 1310 and the side surface 110 of the substrate 11, the width of the first portion 131 in the second direction is the smallest at the position C, and the position D is the intersection position of the first portion 131 and the second portion 132. In the first direction, from the position B to the position C, the width of the first portion 131 of each clamping portion 13 in the second direction gradually decreases. The width of the first portion 131 of each clamping portion 13 in the second direction gradually increases from the position C to the position D.

For example, the orthographic projection of the arc-shaped portion 1310 on the plane where the side surface 110 of the substrate 11 is located within the orthographic projection of the entirety of at least one clamping portion 13 on the plane where the side surface 110 of the substrate 11 is located, so as to ensure that the entirety of the clamping portion 13 is located in the mounting groove 23, so that the gap 3 is nearly zero.

For example, with reference to FIG. 2A and FIG. 2C, in at least one example, for each of the plurality of clamping portions 13, on the plane where the first mask plate 1 is located, the arc-shaped portion 1310 and the connection point B between the arc-shaped portion 1310 and the side surface 110 (as illustrated in FIG. 1, the edge of the substrate 11 near the inner edge 21 of the frame 2) of the substrate 11 and the edge point A (the point on the edge of one end of the second portion 132 away from the substrate near the side wall 230 of the corresponding mounting groove 23) of the second portion 132 of the clamping portion 13 are located on the same straight line perpendicular to the inner edge 23, for example, a straight line L. The connection point B between the arc-shaped portion 1310 and the side surface 110 of the substrate 11 is located in the mounting groove 23 corresponding to the clamping portion 13. That is, the orthogonal projection of the arc-shaped portion 1310 on the plane where the side surface 110 of the substrate 11 is located is within the orthogonal projection of the whole clamping portion 13 on the plane where the side surface 110 of the substrate 11 is located, that is, the connection point B between the arc-shaped portion 1310 and the side surface 110 of the substrate 11 is located within the orthogonal projection of the edge of the second portion 132 away from the substrate 11 on the side surface 110 of the substrate 11. The connection point B between the arc-shaped portion 1310 and the side surface 110 of the substrate 11 is located within the orthographic projection of the mounting groove 23 corresponding to the clamping portion 13 on the side surface 110 of the substrate 11, to enable the whole arc-shaped portion 1310 to be completely located in the corresponding mounting groove 23, so that the gap 3 is reduced, and the substrate 11 and the inner edge 21 of the frame 2 are more closely attached.

In this way, it is possible to achieve the technical effect of ensuring that the whole arc-shaped portion 1310 is completely placed in the corresponding mounting groove 23, to reduce the gap 3.

It is to be noted that, according to the requirements of process accuracy or special design, the connection point between the arc-shaped portion 1310 and the side surface 110 of the substrate 11 can also be located on the side of the orthographic projection of the edge of the second portion 132 away from the clamping portion 13 on the side surface 110 of the substrate 11, that is, the connection point between the arc-shaped portion 1310 and the side surface 110 of the substrate 11 can be located outside the end of the second portion 132 away from the substrate.

For example, all the clamping portions 13 have the same shape and size, and all the arc-shaped portions have the same shape and size. The ratio of the size d of the arc-shaped portion 1310 in the first direction to the maximum dimension h of the clamping portion 13 in the first direction is in a range from 0.15 to 0.2. However, the embodiments of the present disclosure do not limit this, and the size of the clamping portion 13 can be designed according to specific needs.

For example, the side surface 110 of the substrate 11 includes a flat face 1101 located between two adjacent clamping portions of the plurality of clamping portions 13, that is, the part of the side surface 110 of the substrate 11 located between two adjacent clamping portions 13 in FIG. 2C, and the flat face 1101 faces the frame 2. As illustrated in FIG. 2A, the orthographic projection of the flat face 1101 on the plane where the inner edge 21 is located overlaps with the inner edge 21 of the frame 2, and the arc-shaped portion 1310 does not contact the side wall 230 of its corresponding mounting groove 23, the arc-shaped portion 1310 does not contact the inner edge 21 of the frame 2 can further enable the whole arc-shaped portion 1310 to be completely placed in its corresponding mounting groove 23, to reduce the above-mentioned gap 3.

For example, as illustrated in FIG. 2C, in the first direction, the width w of the second portion 132 of each clamping portion 13 in the second direction gradually increases, that is, in the direction opposite to the first direction, the width w of the second portion 132 of each clamping portion 1 in the second direction gradually decreases, which is conducive to smooth connection between the second portion 132 of the clamping portion 13 and the arc-shaped portion 131, so as to shrink one end of the clamping portion 13 connected to the substrate 11 to the mounting groove 23 correspond to it, to reduce the above gap 3.

For example, as illustrated in FIGS. 2A-2C, the cross-section of the second portion 132 of each of the plurality of clamping portions 13 parallel to the first direction has a shape of inverted trapezoid, which is easy to be manufactured; and it is not limited to an inverted trapezoid, the embodiments of the present disclosure do not limit this.

For example, as illustrated in FIG. 2C, in at least one example, all the clamping portions 13 have the same shape and size, and all the arc-shaped portions 1310 have the same shape and size. The ratio of the size d of the arc-shaped portion 1310 in the first direction to the maximum size h of the clamping portion 13 in the first direction is in a range of 0.15-0.2. For example, the maximum size h of the clamping portion 13 in the first direction is 10 mm to 15 mm, and the radius of curvature of the arc-shaped portion 1310 is 0.2 mm to 3 mm. The width of the inverted trapezoid away from the upper bottom of the substrate 11 is 8-15 mm, the width of the inverted trapezoid near the lower bottom of the substrate 11 is 6-13 mm, and the height of the inverted trapezoid in the first direction is 7.7-12.7 mm. The included angle θ between the waist of the inverted trapezoid and the first direction is greater than or equal to 9 degrees, and if this included angle θ is too small, it is not conducive to the combination of the arc-shaped portions, so that the whole arc-shaped portion 1310 is located in the mounting groove. Of course, the above sizes are exemplary and can be changed according to the actually required sizes of the clamping portion 13, so the embodiments of the present disclosure do not limit the above sizes.

For example, as illustrated in FIG. 2A, the maximum width d1 of each mounting groove 23 in the second direction is greater than the maximum width d2 of each clamping portion 13 in the second direction, and the difference between the maximum width d1 of each mounting groove 23 and the maximum width d2 of each clamping portion 13 is in a range from 0.5 mm to 1 mm, so that each clamping portion 13 can be easily mounted into the mounting groove 23, and reserve a space for the clamping portion 13 to expand with heat and shrink with cold in the mounting groove 23. In this example, the orthographic projection of the mounting grooves 23 on the plane where the face of the substrate 11 parallel to the first direction is located is rectangular, so the maximum width d1 of each mounting groove 23 in the extending direction (lateral direction in the figure) perpendicular to each of the plurality of clamping portions 13 is the lateral width of the rectangular mounting groove. A cross-section of the second portion 132 of the clamping portion 13 in a direction parallel to the first direction has a shape of inverted trapezoid, and the maximum width d2 of each clamping portion 13 in the extending direction perpendicular to each of the plurality of clamping portions is the lateral width of the wider bottom edge of the second portion 132.

For example, the depth of the mounting grooves 23 in the direction perpendicular to the plane where the first mask plate 1 is located is greater than or equal to the thickness of the clamping portion 13 in the direction perpendicular to the plane where the first mask plate 1 is located, so that the clamping portion 13 is stably fixed in the corresponding mounting groove 23, and the overall flatness of the mask device 10 including the frame 2 and the first mask plate 1 can be improved. For example, in the direction perpendicular to the plane where the first mask plate 1 is located, the thickness of the first mask plate 1 is equal to the thickness of the clamping portion, both of which are greater than or equal to 100 µm. It is to be noted that the plane where the first mask plate is located refers to the plane where the face of the substrate 11 parallel to the first direction is located.

For example, as illustrated in FIG. 1 and FIG. 2A, the frame 2 includes an inner region 24 and a thinned region 25 (i.e., the peripheral region of the frame) at least partially surrounding the inner region 24, and the thickness of the thinned region 25 in the direction perpendicular to the substrate 11 is less than that of the inner region 24 of the frame 2 in the direction perpendicular to the substrate 11. For example, the thickness of the thinned region 25 in the direction perpendicular to the substrate 11 is several hundred µm, such as 200-300 µm, which is several hundred µm less than the thickness of the inner region 24 in the direction perpendicular to the substrate 11. The thinned region 25 is beneficial to thinning the mask device. The frame 2 further includes a plurality of evaporation mounting grooves 26 located in the thinned region 25, for example, the plurality of evaporation mounting grooves 26 are spaced apart. During the evaporation process by using the mask device 10, the plurality of evaporation mounting grooves 26 are used for matching with a plurality of fixed structures in the evaporation equipment, and the plurality of fixed structures are mounted in the plurality of evaporation mounting grooves 26 in one to one correspondence, so that the mask device 10 can be mounted and fixed in the evaporation equipment.

Figure 3A:
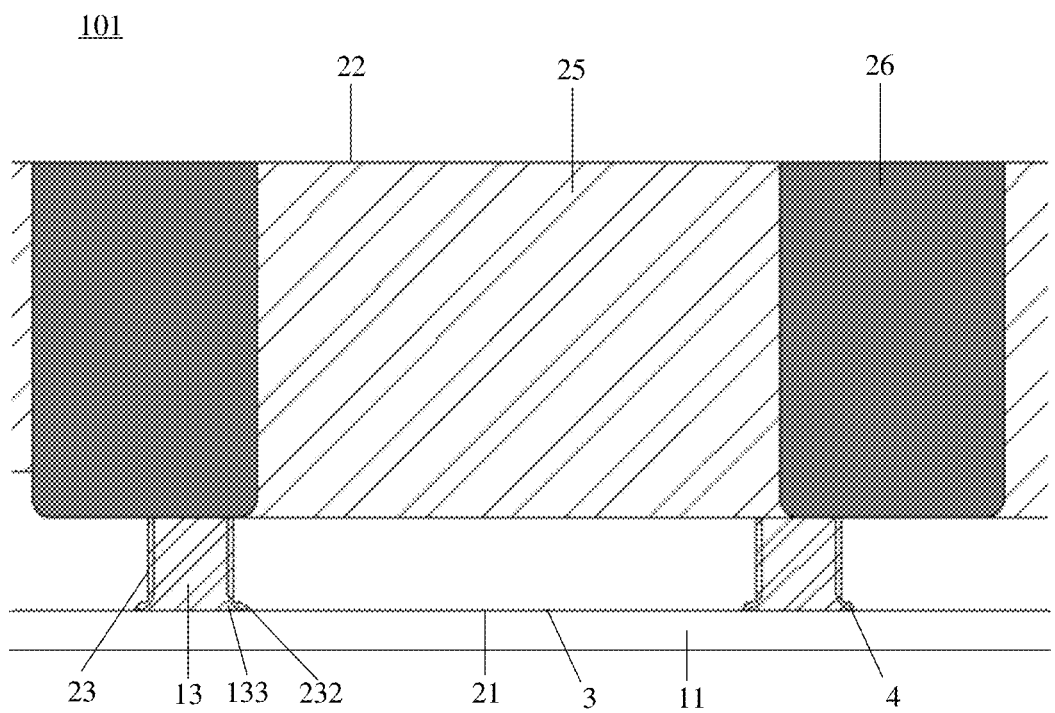
FIG. 3A is a partial structural diagram of another mask device according to an embodiment of the present disclosure.
Figure 3B:
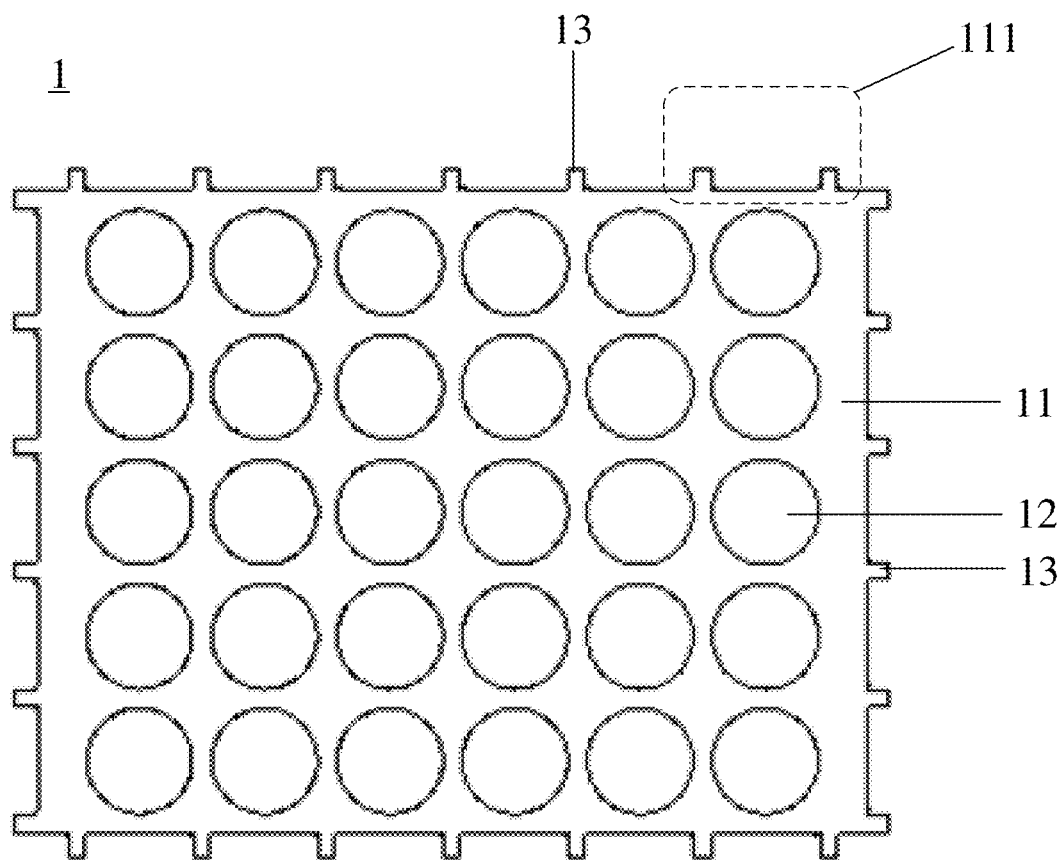
FIG. 3B is a schematic plan view of a mask plate of the mask device illustrated in FIG. 3A.
Figure 3C:
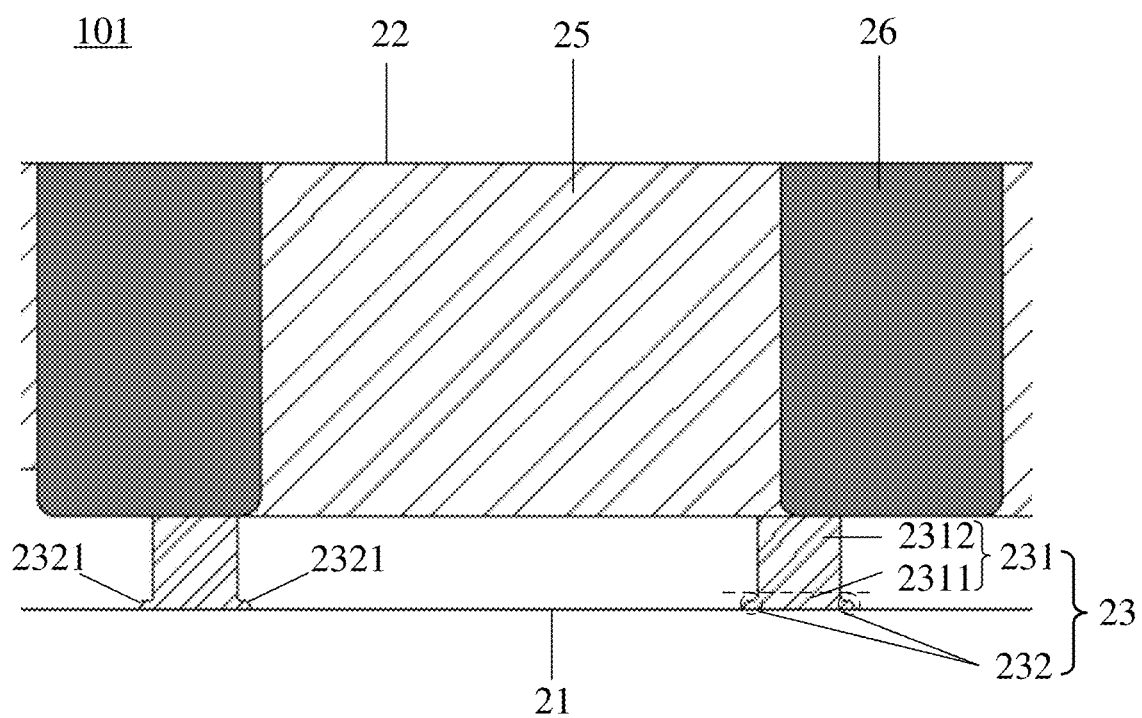
FIG. 3C is a partially enlarged schematic diagram of a frame of the mask device illustrated in FIG. 3A.
Figure 3D:
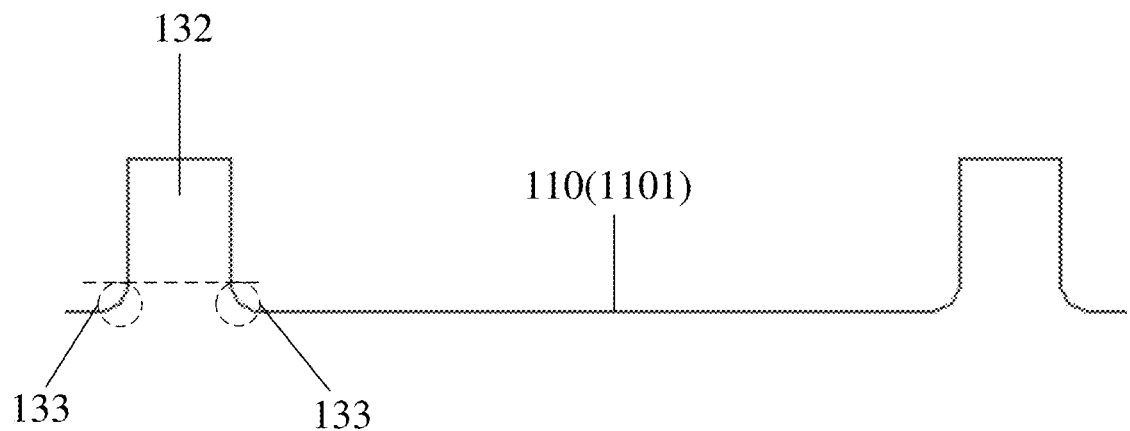
FIG. 3D is a partially enlarged schematic diagram of FIG. 3B.

FIG. 3A is a partial structural diagram of another mask device according to an embodiment of the present disclosure, FIG. 3B is a schematic plan view of a mask plate of the mask device illustrated in FIG. 3A and FIG. 3C, FIG. 3C is a partial enlarged schematic diagram of a frame of the mask device illustrated in FIG. 3A, and FIG. 3D is a partial enlarged schematic diagram of FIG. 3B. For example, FIG. 3A is another enlarged schematic diagram of the part 101 of FIG. 1.

As illustrated in FIG. 3A and FIG. 3C, each of the plurality of mounting grooves 23 includes a main body portion 231 and at least one expansion portion 232. The main body portion 231 includes a first part 2311 near the inner edge 21 and a second part 2312 far away from the inner edge 21. The first part 2311 of the main body portion 231 communicates with the second part 2312 of the main body portion 231, and the expansion portion 232 is located on a side surface of the first part 2311 of the main body portion 231 facing the adjacent mounting groove 23 and extends in the direction away from the main body portion 231. The expansion portion 232 includes an outer contour 2321, which is connected to the inner edge 21. For example, in this embodiment, each of the plurality of mounting grooves 23 includes two expansion portions 232. In this way, the whole clamping portion 13 (including the chamfer at the connection position of the clamping portion 13 and the substrate 11 due to the process restriction) can be accommodated in the corresponding expansion portion 232, so that the gap 3 between the first mask plate 1 and the projection of the inner edge 21 on the plane where the first mask plate 1 is located can be reduced, and the problem caused by the large gap 3 in the evaporation process can be prevented or improved.

Figure 3E:
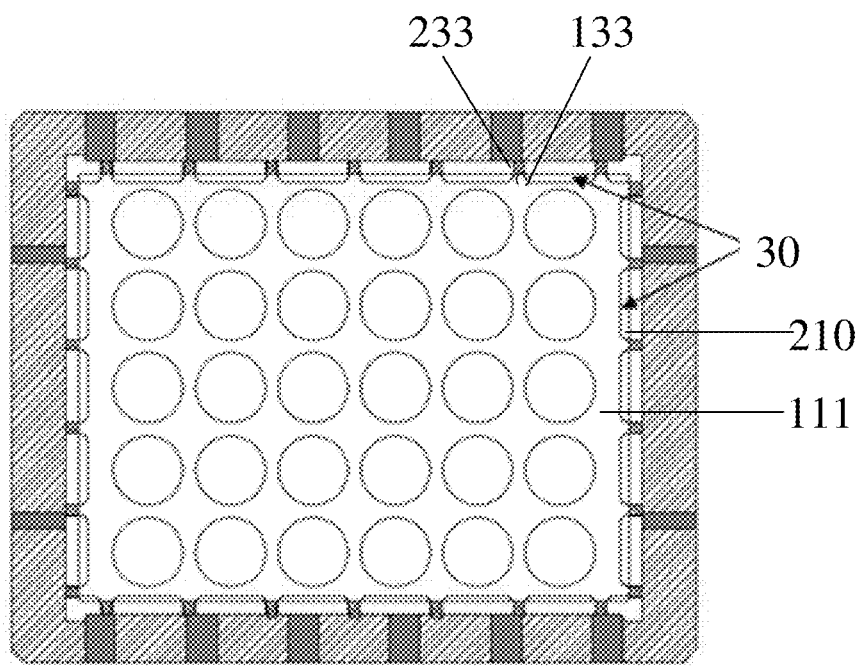
FIG. 3E is a schematic plan view of a mask device.

For example, as illustrated in FIG. 3A, in this embodiment, the arc-shaped portion is a chamfer 133 of each of the plurality of clamping portions 13 at the connection position with the substrate 11, which can be caused by process limitations. At least a part of the chamfer 133 is accommodated in the expansion portion 232, so that a part of the chamfer 133 is located in the mounting groove 23 corresponding to the clamping portion 13, so as to reduce the gap 3. For example, the whole chamfer 133 is completely accommodated in the expansion portion 232, so that the gap between the first mask plate 1 and the projection of the inner edge 21 on the plane where the first mask plate 1 is located can be reduced to be nearly zero. FIG. 3E is a schematic plan view of a mask device. In the mask device illustrated in FIG. 3E, because the chamfer 133 cannot be placed in the mounting groove 233, a large gap 30 exists between the first mask plate 111 and the projection of the inner edge 210 on the plane where the first mask plate 1 is located. The mask device 10 provided by the embodiments of the present disclosure can avoid this problem.

For example, with reference to FIG. 3A and FIG. 3D, the side surface 110 of the substrate 11 includes a flat face 1101 located between two adjacent clamping portions 13. The orthographic projection of the flat face 1101 on the plane where the inner edge 21 of the frame 2 is located overlaps with the inner edge 21, and the chamfer 133 does not contact the inner edge 21 of the frame 2, so as to further enable the whole chamfer 133 to be completely placed in the corresponding mounting groove 23, to reduce the above-mentioned gap 3.

It is to be noted that the explanation of the side surface 110 and the flat face 1101 of the substrate 11 is the same as that in the previous embodiments.

As illustrated in FIG. 3A and FIG. 3C, the expansion portion 232 includes an arc shape protruding in a direction away from the substrate 11. The arc shape is favorable for providing sufficient space for accommodating the chamfer 133, so that the whole chamfer 133 can be fully accommodated in the expansion portion 232.

For example, in the second direction and in a direction from the main body portion 231 to away from the main body 231, the size of the expansion portion 232 in the first direction gradually decreases. In this way, the variation trend of the size of the expansion portion 232 is consistent with that of the chamfer 133 in the first direction, so that the gap 4 between the expansion portion 232 and the chamfer 133 can be reduced, which is beneficial to making the combination of each clamping portion 13 with its corresponding mounting groove 23 more tight and compact, and to improve the stability of the mask device 10. In other embodiments, the height of the expansion portion 232 in the extending direction of the main body portion 231 can be kept unchanged.

For example, the cross-section of the second portion 132 of each of the plurality of clamping portions 13 parallel to the first direction is rectangular, such as the rectangular part (that is, the part above the dotted line in FIG. 3D) located on the side of the chamfer 133 (in this embodiment, the arc-shaped portion) away from the substrate 11 in FIG. 3D, that is, the cross-section of the second portion 132 parallel to the first direction has a shape of rectangle. Or, in other embodiments, each of the plurality of clamping portions 13 includes a portion, which has a plan shape of inverted trapezoid on the plane where the first mask plate 1 is located, the inverted trapezoid includes a first side edge near the substrate 11 and a second side edge away from the substrate 11, and the first side edge is shorter than the second side edge, that is, the second portion 132 in FIG. 3D is replaced by the inverted trapezoid. Compared with a case where the first side edge of the inverted trapezoid is greater than the second side edge, this embodiment is advantageous for one end of the clamping portion 13 near the substrate 11 to be accommodated in the corresponding mounting groove 23, and at the same time, it is advantageous for the stability of the combination of the clamping portion 13 and the mounting groove 23.

Other features of the embodiments illustrated in FIGS. 3A-3D are the same as those in FIGS. 2A-2C, the previous description can be referred to.

Figure 4:
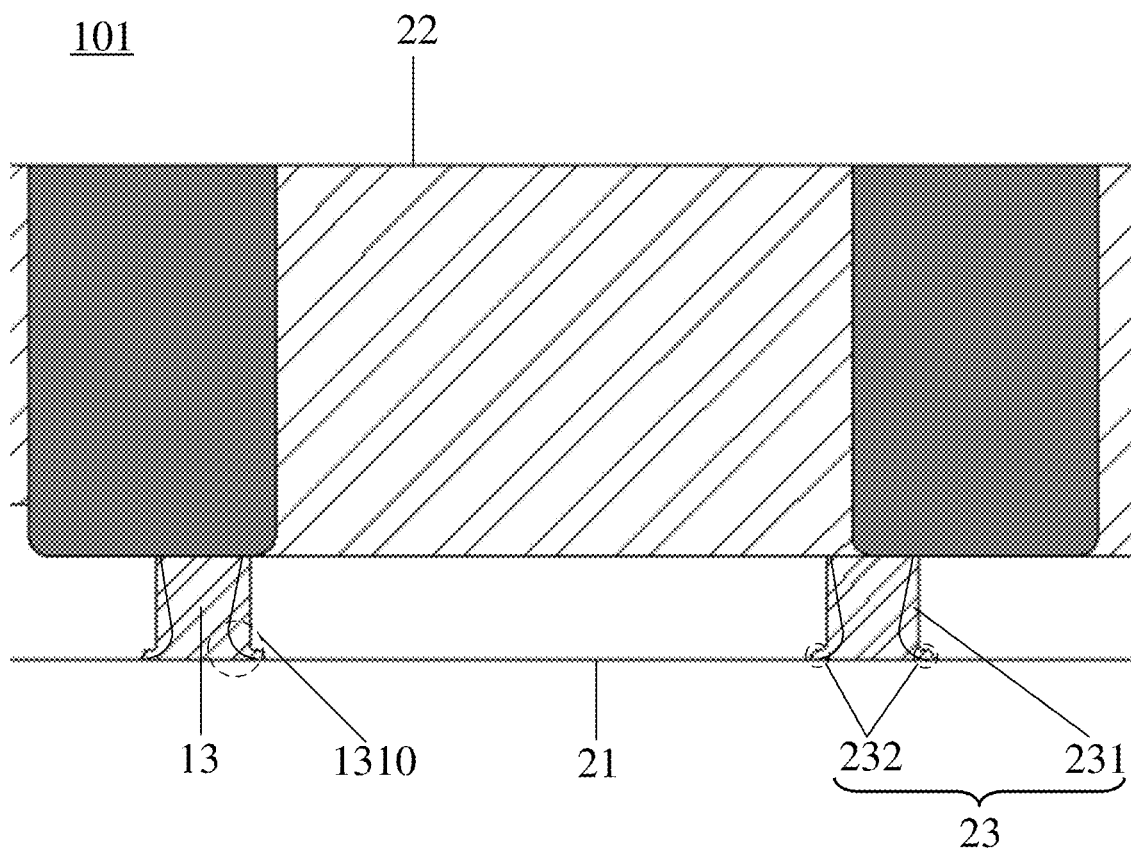
FIG. 4 is a partial structural diagram of another mask device according to an embodiment of the present disclosure.

FIG. 4 is a partial structural diagram of another mask device provided in an embodiment of the present disclosure. The mask device illustrated in FIG. 4 includes the first mask plate in FIG. 2A, and also includes the frame in FIG. 3A. In this way, in the embodiment illustrated in FIG. 4, each of the plurality of clamping portions 13 has a first portion 131 connected to the substrate 11 and a second portion 132 protruding and extending in the direction away from the substrate 11, and on at least one side edge, the first portion 131 has an arc-shaped portion 1310 connected to the substrate and recessed inward. Furthermore, each of the plurality of mounting grooves 23 includes: a main body portion 231 and at least one expansion portion 232. The at least one expansion portion 232 communicates with the main body portion 231, the at least one expansion portion 232 is located at the side edge of the main body portion 231 and connected to the inner edge 21, and extends outward in a direction perpendicular to the extending direction of the main body portion 231. The whole arc-shaped portion 1310 is located in the corresponding mounting groove 23, and at least part of the arc-shaped portion 1310 is located in the corresponding expansion portion 232, so as to reduce the gap between the first mask plate 1 and the projection of the inner edge 21 on the plane where the first mask plate 1 is located, which can achieve the same or similar technical effects as those of the above embodiments.

Without conflicting with each other, the features of the above embodiments can be combined to obtain other embodiments.

Figure 5:
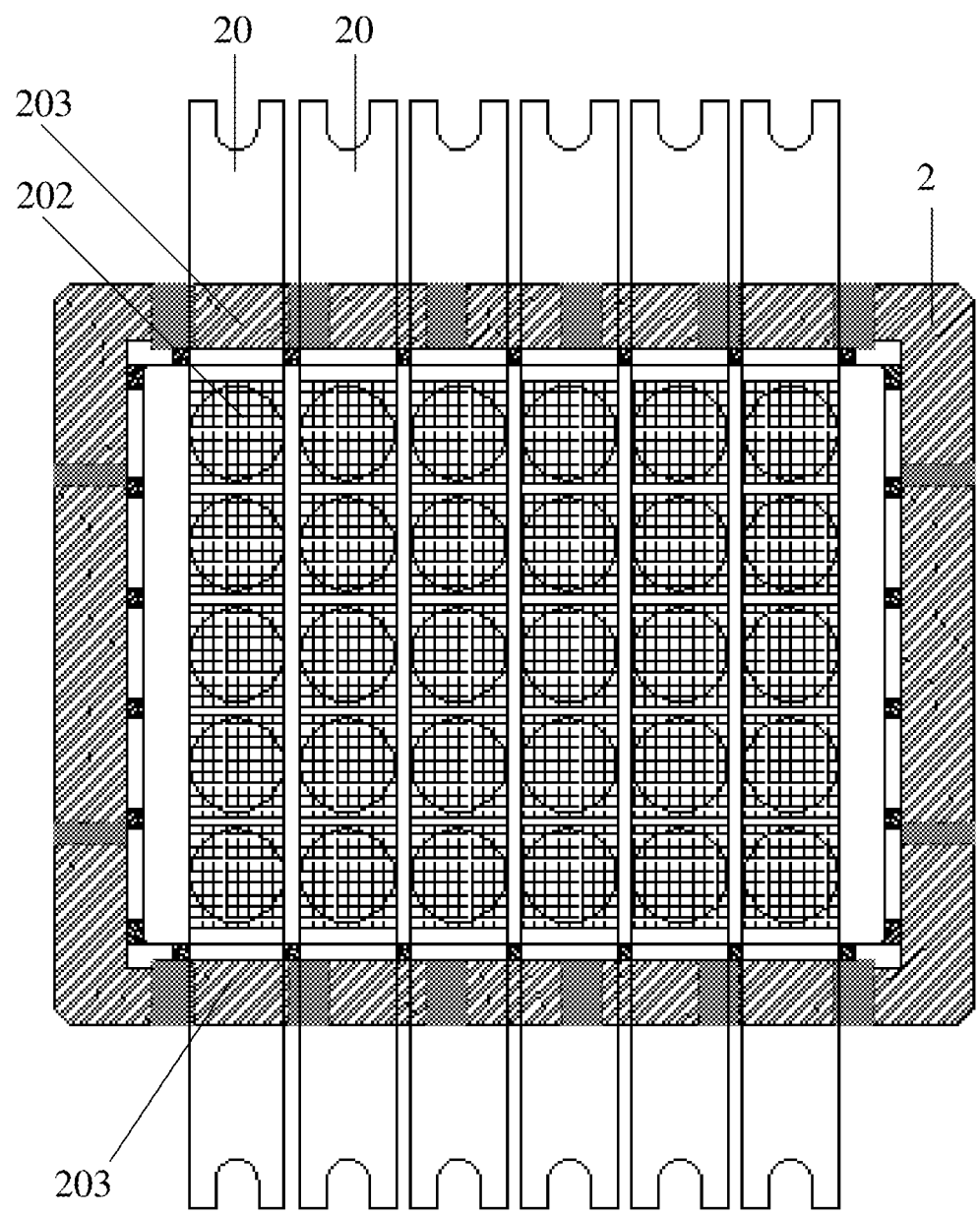
FIG. 5 is a partial structural diagram of another mask device according to an embodiment of the present disclosure

For example, FIG. 5 is a schematic diagram of another mask device provided by at least one embodiment of the present disclosure. As illustrated in FIG. 5, the mask device provided in at least one embodiment of the present disclosure further includes at least one second mask plate 20. For example, the mask device illustrated in this embodiment includes a plurality of second mask plates 20, and each of the plurality of second mask plates 20 is located between two adjacent mounting grooves 23. The plurality of second mask plates 20 are stacked on the first mask plate and directly fixed on the frame 2. Each of the plurality of second mask plates 20 includes at least one second mask opening 202, and the at least one second mask opening 202 at least partially overlaps with the first mask opening 12. The shape and size of the second mask opening 202 match those of the first mask opening 12, and the evaporation area of the evaporation film is limited by the mutual cooperation of the second mask opening 202 and the first mask opening 12 to form a desired evaporation pattern, such as a pixel region pattern.

For example, the first mask plate and the second mask plate stacked on the first mask plate are directly fixed on the frame, on the one hand, it avoids mechanical changes caused by welding between the two mask plates. As mentioned above, such mechanical changes can cause deformation or surface wrinkles of the first mask plate and the second mask plate. The mask device is used for evaporating an object to be evaporated, such as an evaporation substrate, so that the deviation of the evaporation position of the organic thin film caused by the deviation of the pixel opening position of the mask device can be avoided, which avoids the undesirable phenomenon of color mixing on the display picture of the prepared display product and improves the quality of the display product. In addition, because the first mask plate and the second mask plate stacked on the first mask plate are directly fixed on the frame, the first mask plate and the second mask plate will not be closely attached, and there is a proper distance between them, which is beneficial to the flow of a cleaning liquid during evaporation, which effectively improves the undesirable phenomenon of cleaning liquid remaining between the first mask plate and the second mask plate during evaporation.

The second mask plate 20 is a fine metal mask plate. For example, the plan shape of the second mask opening 202 is a conventional rectangle, so that the second mask plate 20 has good netting accuracy and flatness, and is not prone to occur deformation, wrinkles, pixel opening position deviation and other undesirable phenomenon. The second mask plate 20 includes any suitable material, such as copper, aluminum, copper alloy, aluminum alloy, invar alloy, nickel-iron alloy, etc., which is not specifically limited in this embodiment.

For example, the thickness of the second mask plate 20 is 20 μm to 40 μm. If the thickness of the second mask plate 20 is too small, it is not conducive to the stability of the second mask plate 20 after netting. For example, the entire plan shape of the second mask plate 20 is rectangular, such as a strip. The two sides of the second mask plate 20 are netted at the same time, that is, in the extending direction of the second mask plate 20, forces are applied from two ends of the second mask plate 20 to spread and tighten the second mask plate 20 at the same time, which is beneficial to adjusting the netting accuracy and controlling the netting deformation, so that the structure is stable after welding the clamping portions and the mounting grooves, which is beneficial to prolonging the service life of the mask device.

For example, as illustrated in FIG. 1 and FIG. 2A, the frame 2 includes an inner region 24 and a thinned region 25 (i.e., the peripheral region of the frame) at least partially surrounding the inner region 24, and the thickness of the thinned region 25 in the direction perpendicular to the substrate 11 is less than that of the inner region 24 of the frame 2 in the direction perpendicular to the substrate 11. The previous description may be referred to for the size of the thinned region 25. For example, the second mask plate 20 is fixed to the frame 2 by welding, for example, the second mask plate is welded on the inner region 24 between two adjacent mounting grooves 23. At this time, because the thickness of the thinned region 25 is less than that of the inner region 24, there is a height difference between the thinned region 25 and the inner region 24 in the direction perpendicular to the substrate 11, and the edge portion 203 of the second mask plate 20 extending to the outside of the inner region 24 (the side near the thinned region 25) can be pressed down to attach with the thinned region 25, for example, the edge portion 203 of the second mask plate 20 can be better fixed by arranging a pressing sheet on the edge portion 203 attached to the thinned region 25, so that the netting of the second mask plate 20 is more stable. In this way, on the one hand, the thinned region 25 is beneficial to the thinning of the mask device; in addition, the thinned region 25 is also beneficial to making the netting of the second mask plate 20 more stable and the fixing of the second mask plate 20 more firmly.

At least one embodiment of the present disclosure also provides a manufacturing method of the mask device. Referring to FIGS. 2A-2C, the manufacturing method includes: forming a plurality of mounting grooves 23 on the frame 2, and the frame 2 includes an inner edge 21 and an outer edge 22; forming a plurality of first mask openings 12 on the substrate 11 and a plurality of clamping portions 13 protruding and extending outward from at least part of the periphery of the substrate 11; mounting the plurality of clamping portions 13 into a plurality of mounting grooves 23 in one to one correspondence, thereby mounting the substrate 11 to the frame 2. A direction along which the clamping portion 13 extends from the substrate 11 to a direction away from the substrate 11 is a first direction, and a direction perpendicular to the first direction is a second direction. At least one of the clamping portions 13 includes a first portion 131 connected to the substrate 11. For example, in the embodiment illustrated in FIG. 2C, in the first direction, the size of the whole first portion 131 in the second direction gradually decreases; at least part of the first portion 131 can extend into the mounting groove 23 corresponding to the clamping portion 13, that is, the connection position between each clamping portion 13 and the substrate 11 is located in the mounting groove 23 corresponding to the clamping portion 13, so that the gap between the substrate 11 and the orthographic projection of the inner edge 21 of the frame 2 on the plane where a plane of the substrate 11 parallel to the first direction is located is less than the size of the first portion 131 of the at least one clamping portion 13 in the first direction. For example, the connection position between each of the plurality of clamping portions 13 and the substrate 11 is located in the mounting groove 23 corresponding to the clamping portion 13, and the gap 3 between the first mask plate 1 and the inner edge 21 is less than 2 mm.

For example, in an embodiment, the first mask plate 1 is basically abutted with the projection of the inner edge 21 on the plane where the first mask plate 1 is located, that is, the width of the gap 3 between the substrate 11 and the inner edge 21 is nearly zero, or the overlapping area of the first mask plate 1 and the projection of the inner edge 21 on the plane where the first mask plate 1 is located is greater than or equal to zero, so as to achieve a tighter assembly effect and better prevent the above technical problems caused by the gap 3.

For example, the patterns of the plurality of clamping portions 13 and the plurality of mounting grooves 23 are formed by a patterning process, such as a photolithography process. For example, as illustrated in FIGS. 2A-2C, at least one clamping portion 13 of the plurality of clamping portions 13, for example, each clamping portion 13, further includes a second portion 132, which is located at one side of the first portion 131 away from the substrate 11 and protrudes and extends in the direction away from the substrate 11, and the second portion 132 is connected to the first portion 131 of the substrate 11. For example, in the embodiment illustrated in FIG. 2C, in the first direction, the width of the whole first portion 131 of each clamping portion 13 in the second direction gradually decreases. The first portion 131 includes a side edge, and the side edge of the first portion 131 faces a clamping portion 13 adjacent to the clamping portion 13. The side edge of the first portion 131 has an arc-shaped portion 1310 which is smoothly connected to the substrate 11 and recessed toward the clamping portion 13. The periphery of the substrate 11 includes a side surface 110, the side surface 110 is provided with a plurality of clamping portions 13 and faces the inner edge 21 of the frame 2. The orthographic projection of the arc-shaped portion 1310 on the plane where the side surface of the substrate 11 is located is within the orthographic projection of the whole at least one clamping portion 13 on the plane of the side surface 110 of the substrate 11. For example, in the embodiment illustrated in FIGS. 2A-2C, two sides of the first portion 131 facing the side walls 230 of the mounting groove 23 corresponding to the clamping portion 13 have arc-shaped portions 1310. Because the width of the arc-shaped portion 1310 recessed inward in the second direction gradually decreases in the first direction, one end of the clamping portion 13 connected to the substrate 11 can be totally shrunk into the corresponding mounting groove 23, that is, the one end of the clamping portion 13 connected to the substrate 11 is completely located in the corresponding mounting groove 23, so as to reduce the gap 3 between the first mask plate 1 and the projection of the inner edge 21 on the plane where the first mask plate 1 is located, and achieve the above technical effect.

In the mask device obtained after mounting the plurality of clamping portions 13 into the plurality of mounting grooves 23 in a one to one correspondence, for example, as illustrated in FIG. 2A and FIG. 2C, for each of the plurality of clamping portions 13, on the plane where the first mask plate 1 is located, the connection point B between the arc-shaped portion 1310 and the side surface 110 (as illustrated in FIG. 1, the edge of the substrate 11 near the inner edge 21 of the frame 2) of the substrate 11 and the edge point A (the point on the edge of one end of the second portion 132 away from the substrate near the side wall 230 of the corresponding mounting groove 23) of the second portion 132 of the clamping portion 13 are located on the same straight line perpendicular to the inner edge 23, for example, a straight line L. The connection point B between the arc-shaped portion 1310 and the side surface 110 of the substrate 11 is located in the mounting groove 23 corresponding to the clamping portion 13, so as to reduce the above-mentioned gap 3.

It is to be noted that, on the plane where the substrate is located, the connection point between the arc-shaped portion and the side edge of the substrate refers to that the tangent line of the arc-shaped portion at the connection point is just on the side surface of the substrate.

For example, the side surface 110 of the substrate 11 includes a flat face 1101 located between two adjacent clamping portions 13 of the plurality of clamping portions 13, the flat face 1101 is a part of the side surface 110 of the substrate 11 located between two adjacent clamping portions 13 of the plurality of clamping portions in FIG. 2C. As illustrated in FIG. 2A, the orthographic projection of the flat face 1101 on the plane where the inner edge 21 is located overlaps with the inner edge 21, and the arc-shaped portion 1310 does not contact the side wall 230 of the corresponding mounting groove 23, so as to further enable the whole arc-shaped portion 1310 to be completely placed in the corresponding mounting groove 23, so as to reduce the gap 3.

For example, as illustrated in FIG. 2C, in the first direction, the width w of the second portion 132 of each of the plurality of clamping portions 13 in the direction perpendicular to the first direction gradually decreases to facilitate smooth connection with the arc-shaped portion 131.

For example, as illustrated in FIGS. 2A-2C, a plan shape of the second portion 132 of each of the plurality of clamping portions 13 on a plane where the first mask plate 1 is located is an inverted trapezoid, that is, the cross-section of the second portion 132 parallel to the first direction is inverted trapezoidal.

The above features and technical effects of the mask device illustrated in FIGS. 2A-2C obtained by the manufacturing method provided by the embodiments of the present disclosure, as well as other structural features and technical effects not mentioned, are the same as those of the previous embodiments of the mask device, the previous description may also be referred to.

The manufacturing method provided by another embodiment is different from the above manufacturing method in that the shape of each of the plurality of mounting grooves obtained by the patterning process is different from that of the previous embodiments, and the shape of each of the plurality of clamping portions obtained by the patterning process is different from that of the previous embodiments. As illustrated in FIGS. 3A-3D, each of the plurality of mounting grooves 23 includes a main body portion 231 and at least one expansion portion 232. The main body portion 231 includes a first part 2311 near the inner edge 21 and a second part 2312 away from the inner edge 21. The first part 2311 of the main body portion 231 communicates with the second part 2312 of the main body portion 231, and the expansion portion 232 is located on the side surface of the first part 2311 of the main body portion 231 facing the adjacent mounting groove 23 and extends in the direction away from the main body portion 231. The expansion portion 232 includes an outer contour 2321, the outer contour 2321 is connected to the inner edge 21. For example, in this embodiment, each of the plurality of mounting grooves 23 includes two expansion portions 232. In this way, the chamfer 133 (for example, in this embodiment, the arc-shaped portion can also be a chamfer because of the manufacturing process limitation, and in other embodiments, the arc-shaped portion can be a structure specially designed according to the above-mentioned characteristics of the arc-shaped portion) at the connection position between the clamping portion 13 and the substrate 11 because of the manufacturing process limitation can be accommodated in the corresponding expansion portion 232, so as to reduce the gap 3 between the first mask plate 1 and the projection of the inner edge 21 on the plane where the first mask plate 1 is located, and to achieve the above technical effects.

For example, with reference to FIG. 3A and FIG. 3D, the side surface 110 of the substrate 11 includes a flat face 1101 located between two adjacent clamping portions 13 of the plurality of clamping portions 13. The orthographic projection of the flat face 1101 on the plane where the inner edge 21 of the frame 2 is located overlaps with the inner edge 21, and the chamfer 133 does not contact the inner edge 21 of the frame 2, so as to further enable the whole chamfer 133 to be completely placed in the corresponding mounting groove 23, and to reduce the above-mentioned gap 3.

As illustrated in FIG. 3A and FIG. 3C, the expansion portion 232 includes an arc shape protruding in a direction away from the substrate 11. The arc shape is favorable for providing sufficient space for accommodating the chamfer 133, so that the whole chamfer 133 can be fully accommodated in the expansion portion 232.

For example, in the second direction and in the direction from the main body portion 231 to away from the main body portion 231, the size of the expansion portion 232 in the first direction gradually decreases. In this way, the variation trend of the size of the expansion portion 232 is consistent with that of the chamfer 133 in the first direction, so that the gap 4 between the expansion portion 232 and the chamfer 133 can be reduced, which is beneficial to making the combination of each clamping portion 13 with its corresponding mounting groove 23 more tight and compact, and improving the stability of the mask device 10.

For example, each of the plurality of clamping portions 13 includes a portion, which has a plan shape of rectangle on the plane where the first mask plate 1 is located, as illustrated in FIG. 3D, the cross-section of the second portion 132 located on the side of the chamfer 133 away from the substrate 11 is rectangular in the first direction. Or, in other embodiments, the cross-section of the second portion 132 of each of the plurality of clamping portions 13 in the first direction is an inverted trapezoid, the inverted trapezoid includes a first side edge near the substrate 11 and a second side edge away from the substrate 11, and the first side edge is shorter than the second side edge, that is, the second portions 132 in FIG. 3D are replaced by the inverted trapezoids. Compared with a case where the first side edge of the inverted trapezoid is greater than the second side edge, this embodiment is advantageous for one end of the clamping portion 13 near the substrate 11 to be accommodated in the corresponding mounting groove 23, and at the same time, it is advantageous for the stability of the combination of the clamping portion 13 and the mounting groove 23.

The above features and technical effects of the mask device illustrated in FIGS. 3A-3C obtained by the manufacturing method provided by the embodiments of the present disclosure, as well as other structural features and technical effects not mentioned, are the same as those of the previous embodiments of the mask device, the previous description can be referred to.

For example, as illustrated in FIG. 5, the manufacturing method of the mask device provided by another embodiment of the present disclosure further includes: providing at least one second mask plate 20, each of the at least one second mask plate 20 is located between two adjacent mounting grooves of the plurality of mounting grooves 23; stacking the at least one second mask plate 20 on the first mask plate 1 and directly fixed on the frame 2, each of the at least one second mask plate 20 includes at least one second mask opening 202 that at least partially overlaps with the first mask opening 12. For example, the mask device includes a plurality of second mask plates 20. At least one second mask plate 20 is fixed on the frame 2, for example, by a welding process. For other features of the second mask plate 20 and technical effects of providing at least one second mask plate 20, the description in the previous embodiments can be referred to.

At least one embodiment of the present disclosure also provides a mask plate, the mask plate includes: a substrate, at least one first mask opening arranged on the substrate, and a plurality of clamping portions. The plurality of clamping portions protrude and extend outward from at least part of the periphery of the substrate. A direction along which the clamping portion extends from the substrate to a direction away from the substrate is a first direction, and a direction perpendicular to the first direction is a second direction; at least one of the plurality of clamping portions includes a first portion connected to the substrate; the width of at least part of the first portion of the at least one clamping portion in the second direction gradually decreases in the first direction.

Exemplarily, as illustrated in FIGS. 2A-2C, the first mask plate 1 includes a substrate 11, at least one first mask opening 12 arranged on the substrate, and a plurality of clamping portions 13 protruding and extending outward from at least part of the periphery of the substrate 11. A direction along which the clamping portion 13 extends from the substrate 11 to a position away from the substrate 11 is a first direction, and a direction perpendicular to the first direction is a second direction. At least one clamping portion 13 of the plurality of clamping portions 13 includes a first portion connected to the substrate 11. In the first direction, the width of at least part of the first portion of the at least one clamping portion 13 in the second direction gradually decreases. As illustrated in FIG. 2C, the position B is the intersection point of the arc-shaped portion 1310 and the side surface 110 of the substrate 11, and the position C is the intersection position of the first portion 131 and the second portion 132. That is, in the first direction and from the position B to the position C, the width of the whole first portion 131 of each clamping portion 13 in the second direction gradually decreases. For another example, in the embodiment illustrated in FIG. 2D, the width of the first portion 131 of each clamping portion 13 in the second direction first gradually decreases and then gradually increases. The position B is the intersection point of the arc-shaped portion 1310 and the side surface 110 of the substrate 11, the width of the first portion 131 in the second direction is the smallest at the position C, and the position D is the intersection position of the first portion 131 and the second portion 132. In the first direction, from the position B to the position C, the width of the first portion 131 of each clamping portion 13 in the second direction gradually decreases. In the first direction and from the position C to the position D, the width of the first portion 131 of each clamping portion 13 in the second direction gradually increases. In the mask plate provided by the embodiment of the present disclosure, because the width of at least part of the arc-shaped portion 1310 recessed inward in the second direction gradually decreases in the first direction, when the mask plate is mounted on the frame, one end of the clamping portion 13 connected to the substrate 11 can be integrally shrunk into the corresponding mounting groove, and which lowers the requirement for the shape of the mounting groove, and reduces the gap between the mask plate and the frame.

For example, the first portion 131 includes a side edge, and the side edge of the first portion 131 faces a clamping portion 13 adjacent to the clamping portion 13 including this first portion 131. The side edge of the first portion 131 has an arc-shaped portion 1310 which is smoothly connected to the substrate 11 and recessed toward the clamping portion 13. The periphery of the substrate 11 includes a side surface 110, the side surface 110 is intersected with a face of the substrate 11 parallel to the first direction, and a plurality of clamping portions 13 are provided on the side surface 110. The orthographic projection of the arc-shaped portion 1310 on the plane where the side surface 110 of the substrate 11 is located is within the orthographic projection of the whole at least one clamping portion 13 on the plane where the side surface 110 of the substrate 11 is located, so as to enable the whole clamping portion 13 to be located in the mounting groove 23, so that the gap between the mask plate and the frame is nearly zero.

For example, as illustrated in FIG. 2C, at least one clamping portion 13 of the plurality of clamping portions 13, for example, each clamping portion 13, includes a second portion 132, the second portion is located at one side of the first portion 131 away from the substrate 11 and protrudes and extends in the direction away from the substrate 11, and the second portion 132 is connected to the first portion 131 of the substrate 11. A connection point B between the arc-shaped portion 1310 and the side surface 110 of the substrate 11 is within an orthographic projection of the edge of the second portion away from the substrate on the side surface of the substrate. That is, the connection point B between the arc-shaped portion 1310 and the side surface 110 of the substrate 11 is located on the side of the orthographic projection of the edge A of the second portion 132 away from the substrate 11 on the side surface 110 of the substrate 11, and the side is near the clamping portion 13, so as to enable the whole clamping portion 13 to be located in the mounting groove 23, and enable the whole arc-shaped portion 1310 to be completely placed in the corresponding mounting groove, so that the gap between the mask plate and the frame is nearly zero.

For example, as illustrated in FIG. 2C, in the first direction and from position B to position C, the width of the whole first portion 131 of each clamping portion 13 in the second direction gradually decreases, so that one end of the clamping portion 13 connected to the substrate 11 is shrunk into the corresponding mounting groove 23, which is beneficial to reducing the gap between the mask plate and the frame. Or, as illustrated in FIG. 2D, the width of the first portion 131 of each clamping portion 13 in the second direction first gradually decreases and then gradually increases. The position B is the intersection point of the arc-shaped portion 1310 and the side surface 110 of the substrate 11, the width of the first portion 131 in the second direction is the smallest at the position C, and the position D is the intersection position of the first portion 131 and the second portion 132. In the first direction, from the position B to the position C, the width of the first portion 131 of each clamping portion 13 in the second direction gradually decreases. From the position C to the position D, the width of the first portion 131 of each clamping portion 13 in the second direction gradually increases, which is also beneficial to reducing the gap between the mask plate and the frame. Furthermore, in the second direction, the width w of the second portion 132 of each clamping portion 13 in the second direction gradually increases, that is, in the direction opposite to the first direction, the width w of the second portion 132 of each clamping portion 13 in the second direction gradually decreases, which is beneficial to the smooth connection between the second portion 132 of the clamping portion 13 and the arc-shaped portion 131.

For example, as illustrated in FIGS. 2A-2C, the plan shape of the second portion 132 of each of the plurality of clamping portions 13 on the plane where the first mask plate 1 is located has a shape of inverted trapezoid, which is easy to be manufactured, and it is not limited to the inverted trapezoid, the embodiments of the present disclosure do not limit this.

In this embodiment, other features of the mask plate that are not mentioned are the same as those of the first mask plate in the embodiments of the mask device, so reference can be made to the previous description, which will not be repeated here.

At least one embodiment of the present disclosure also provides a frame, the frame includes a plurality of mounting grooves. At least one mounting groove of the plurality of mounting grooves includes: a main body portion and at least one expansion portion. The at least one expansion portion communicates with the main body portion. The main body portion includes a first part near the inner edge and a second part away from the inner edge; the first part of the main body portion communicates with the second part of the main body portion, and the expansion portion is located on a side surface of the first part of the main body portion facing the adjacent mounting groove and extends in a direction away from the main body portion; the expansion portion includes an outer contour; and the outer contour is connected to the inner edge.

Exemplarily, as illustrated in FIG. 3A and FIG. 3C, each of the plurality of mounting grooves 23 includes a main body portion 231 and at least one expansion portion 232. The main body portion 231 includes a first part 2311 near the inner edge 21 and a second part 2312 away from the inner edge 21. The first part 2311 of the main body portion 231 communicates with the second part 2312 of the main body portion 231, and the expansion portion 232 is located on a side surface of the first part 2311 of the main body portion 231 facing the adjacent mounting groove 23 and extends in the direction away from the main body portion 231. The expansion portion 232 includes an outer contour 2321, the outer contour 2321 is connected to the inner edge 21. For example, in this embodiment, each of the plurality of mounting grooves 23 includes two expansion portions 232. The plurality of mounting grooves 23 can be used to accommodate the clamping portions 13 of the mask plate to be mounted on the frame, so as to mount the mask plate on the frame. Because of the limitation of the preparing process, the clamping portion of the mask plate often has a chamfer 133, so that the chamfer 133 can be accommodated in the corresponding expansion portion 232, so that the whole clamping portion 13 can be accommodated in the mounting groove 23, and the gap between the first mask plate 1 and the projection of the inner edge 21 on the plane where the first mask plate 1 is located can be reduced, which can prevent or improve the problems of unstable installation and dust accumulation caused by the large gap in the evaporation process.

For example, in the second direction and in the direction from the main body portion 231 to away from the main body portion 231, the size of the expansion portion 232 in the first direction gradually decreases. In this way, the variation trend of the size of the expansion portion 232 is consistent with that of the chamfer 133 in the first direction, so that the gap 4 between the expansion portion 232 and the chamfer 133 can be reduced, which is beneficial to making the combination of each clamping portion 13 with its corresponding mounting groove 23 more tight and compact, and for improving the stability of the mask device 10. In other embodiments, the height of the expansion portion 232 in the extending direction of the main body portion 231 can be kept unchanged.

In this embodiment, other features of the frame not mentioned are the same as those of the mask plate in the embodiments of the mask device, so reference can be made to the previous description, and they will not be repeated here.

The description above is only about the exemplary embodiments of the present disclosure, and the scope of the present disclosure is not limited thereto. The scope of the present disclosure is defined by the claims.

What is claimed is:

1. A mask device, comprising:
a frame comprising an inner edge, an outer edge, and a plurality of mounting grooves;
a first mask plate comprising a substrate, at least one first mask opening arranged on the substrate, and a plurality of clamping portions protruding and extending outward from at least part of a periphery of the substrate,
wherein the plurality of clamping portions are configured to be mounted in the plurality of mounting grooves in one to one correspondence, so that the substrate is configured to be mounted on the inner edge of the frame;
a direction along which the clamping portion extends from the substrate to a direction away from the substrate is a first direction, a direction perpendicular to the first direction is a second direction; at least one of the plurality of clamping portions comprises a first portion connected to the substrate, and a size of at least part of the first portion in the second direction gradually decreases in the first direction; and
at least part of the first portion is extendable into a corresponding mounting groove of the plurality of mounting grooves, so that a gap between the substrate and an orthographic projection of the inner edge of the frame on a plane where a face of the substrate parallel to the first direction is located is less than a size of the first portion of the at least one of the plurality of clamping portions in the first direction;
the at least one of the plurality of clamping portions further comprises a second portion, and the second portion is at a side of the first portion away from the substrate and protrudes and extends in a direction away from the substrate,
the first portion comprises a side edge, the side edge of the first portion faces a clamping portion adjacent to the at least one of the plurality of clamping portions, and the side edge of the first portion has an arc-shaped portion which is smoothly connected to the substrate and recessed toward the clamping portion; and
the periphery of the substrate comprises a side surface, the side surface of the substrate comprises a flat face between two adjacent arc-shaped portions respectively of two adjacent clamping portions of the plurality of clamping portions, the side surface of the substrate is provided with the plurality of clamping portions and faces the inner edge of the frame; an orthographic projection of the arc-shaped portion on a plane where the flat face of the side surface of the substrate is located is within an orthographic projection of an entirety of the at least one clamping portion on the plane where the flat face of the side surface of the substrate is located;
on a plane where the substrate is located, a connection point between the arc-shaped portion and the flat face of the side surface of the substrate is within an orthographic projection of an edge of the second portion away from the substrate on the flat face of the side surface of the substrate; and the connection point between the arc-shaped portion and the flat face of the side surface of the substrate is within an orthographic projection of at least one of the plurality of mounting grooves corresponding to the at least one of the clamping portions on the flat face of the side surface of the substrate;
each of the plurality of mounting grooves is connected with the inner edge and depressed toward a direction away from the first mask plate, the inner edge of the frame is straight and flat, and both each of the plurality of mounting grooves and the inner edge of the frame do not include a curved surface with a shape complementary to a shape of the arc-shaped portion, and the arc-shaped portion does not contact the inner edge of the frame.

2. The mask device according to claim 1, wherein the first mask plate is abutted with a projection of the inner edge on a plane where the first mask plate is located.

3. The mask device according to claim 1, wherein all of the plurality of clamping portions have a same shape and a same size, and all arc shaped portions of the plurality of clamping portions have a same shape and a same size; and a ratio of a size of the arc-shaped portion in the first direction to a maximum size of the at least one of the plurality of clamping portions in the first direction is in a range from 0.15 to 0.2.

4. The mask device according to claim 1, wherein an orthographic projection of the flat face on a plane where the inner edge is located overlaps with the inner edge of the frame.

5. The mask device according to claim 1, wherein, in the first direction, a width of the second portion of the at least one clamping portion in the second direction gradually increases; a width of the first portion of the at least one clamping portion in the second direction gradually decreases, or a width of the first portion of the at least one clamping portion in the second direction gradually decreases first and then gradually increases.

6. The mask device according to claim 5, wherein a plan shape of the second portion of the at least one clamping portion on a plane where the substrate is located is an inverted trapezoid.

7. The mask device according to claim 1, wherein at least one mounting groove of the plurality of mounting grooves comprises:
a main body portion;
at least one expansion portion communicated with the main body portion, wherein the main body portion comprises a first part near the inner edge and a second part away from the inner edge, the first part of the main body portion communicates with the second part of the main body portion, and the expansion portion is located on a side surface of the first part of the main body portion facing an adjacent one of the plurality of mounting grooves and extends in a direction away from the main body portion; and the expansion portion comprises an outer contour connected to the inner edge.

8. The mask device according to claim 7, wherein the arc-shaped portion is configured to be wholly located in the mounting groove corresponding to the clamping portion, and at least part of the arc-shaped portion is configured to be accommodated in the expansion portion.

9. The mask device according to claim 8, wherein a side surface of the substrate comprises a flat face between two adjacent clamping portions, an orthographic projection of the flat face on a plane where the inner edge is located overlaps with the inner edge, and the arc-shaped portion does not contact the inner edge of the frame.

10. The mask device according to claim 7, wherein, in the second direction and in a direction from the main body portion to away from the main body portion, a size of the expansion portion in the first direction gradually decreases; and
wherein a cross-section of the second portion of each of the plurality of clamping portions parallel to the first direction has a shape of rectangle or inverted trapezoid, and the inverted trapezoid comprises a first side edge near the substrate and a second side edge away from the substrate, and the first side edge is shorter than the second side edge.

11. The mask device according to claim 2, wherein a maximum width of each of the mounting grooves in the second direction is greater than a maximum width of each of the clamping portions, and a difference between a maximum width of each of the mounting grooves and a maximum width of each of the clamping portions is in a range from 0.5 mm to 1 mm.

12. The mask device according to claim 1, wherein a depth of each of the plurality of mounting grooves in a direction perpendicular to a plane where the first mask plate is located is greater than or equal to a thickness of each of the clamping portions in a direction perpendicular to the plane where the first mask plate is located.

* * * * *